United States Patent [19]
Imai et al.

[11] Patent Number: 6,140,025
[45] Date of Patent: Oct. 31, 2000

[54] NEGATIVE TYPE PHOTOSENSITIVE RESIN COMPOSITION AND METHOD FOR FORMING RESIST PATTERN

[75] Inventors: Genji Imai; Hideo Kogure, both of Kanagawa, Japan

[73] Assignee: Kansai Paint Co., Ltd., Japan

[21] Appl. No.: 09/154,047

[22] Filed: Sep. 16, 1998

[51] Int. Cl.$^7$ ..................................................... G03F 7/30
[52] U.S. Cl. ............................................................ 430/325
[58] Field of Search .................................. 430/370.1, 325

[56] References Cited

U.S. PATENT DOCUMENTS

| | | | |
|---|---|---|---|
| 4,548,890 | 10/1985 | Dickinson et al. | 430/280 |
| 5,055,439 | 10/1991 | Allen et al. | 502/158 |
| 5,849,809 | 12/1998 | Narang et al. | 522/35 |

OTHER PUBLICATIONS

Focal Encyclopedea of Photography, Fletcher and Son, Great Britain, 1969, pp. 1313–1315.

*Primary Examiner*—Janet Baxter
*Assistant Examiner*—Rosemary Ashton
*Attorney, Agent, or Firm*—Burns, Doane, Swecker, & Mathis, L.L.P.

[57] ABSTRACT

A negative type photosensitive resin composition is herein disclosed which is used under the irradiation circumstance of a safelight having a maximum wavelength within the range of 500 to 620 nm and a large spectral luminous efficiency; the composition being a liquid or a solid resin composition containing a photocurable resin, a photoreaction initiator and if necessary, a photosensitizing dye; an absorbancy of an unexposed film formed from this composition being 0.5 or less within the range of the maximum wavelength ±30 nm selected from the range of the maximum wavelength of the safelight. By the use of this negative type photosensitive resin composition, it is possible to form a resist pattern which is excellent in safe operativity, operational efficiency, the quality stability of products, and the like.

7 Claims, 3 Drawing Sheets

NEGATIVE TYPE PHOTOSENSITIVE RESIN COMPOSITION AND METHOD FOR FORMING RESIST PATTERN

BACKGROUND OF THE INVENTION

1. Field of the Invention

The present invention relates to a novel negative type photosensitive resin composition and a method for forming a resist pattern.

2. Description of the Related Art

A negative type photosensitive resin composition has excellent characteristics in points of no environmental pollution, the saving of resources and energy, high production efficiency and the like, and for this reason, the composition has heretofore been used as a coating composition, an ink and an adhesive in many fields. This kind of photosensitive resin composition has been applied to use purposes in which circuit boards, plastics, lumbers, metals, papers, glasses, fibers and the like are used as materials.

However, when such a negative type photosensitive resin composition is industrially produced and applied to a practical application, the following problems are present.

Nowadays, there have been used many photosensitive resin compositions which react with the aid of a photoreaction initiator activated by a visible light to form a cured film.

For an emission spectrum wavelength of the visible light which has heretofore been used for the curing, activated lights of 488 nm, 532 nm and the like have been usually used. In the case that such a negative type photosensitive resin composition is handled, an electric lamp such as a fluorescent lamp colored by coating an outer tube of the lamp with a dark red colorant or by winding a dark red film around the outer tube is used as a safelight (a working lamp). Under the environment of such a dark red safelight, however, some problems are present. For example, it is difficult to inspect the state of a coating film after the coating, and it is not easy to check a coating apparatus, an irradiation apparatus, a conveying apparatus and the like. In consequence, safe working properties, working efficiency, quality stability of products and the like are poor. In addition, in the case that an uncolored fluorescent lamp is used as the safelight, the working environment is illuminated and there are not the above-mentioned problems any more, but even portions where the exposure is not required might be exposed inconveniently, depending on the kind of photosensitive resin.

SUMMARY OF THE INVENTION

The present invention has been intended for the purpose of developing a negative type photosensitive resin composition which can be handled under conditions of a bright safelight, and a method for forming a resist pattern by the use of this composition.

The present inventors have conducted intensive research with the intention of solving the above problems, and as a result, it has been found that combining a specific negative type photosensitive resin composition and a specific safelight can solve the conventional problems. In consequence, the present invention has been completed.

That is to say, the aspects of the present invention are as follows:

1. A negative type photosensitive resin composition which is used under the irradiation circumstance of a safelight having a maximum wavelength within the range of 500 to 620 nm and a large spectral luminous efficiency; the composition being a liquid or a solid resin composition containing a photocurable resin, a photoreaction initiator and if necessary, a photosensitizing dye; an absorbancy of an unexposed film formed from this composition being 0.5 or less within the range of the maximum wavelength ±30 nm selected from the range of the maximum wavelength of the safelight.

2. The above-mentioned negative type photosensitive resin composition wherein the safelight is given from a discharge lamp containing sodium as a main component (which consists mainly of a D-ray having a light wavelength of 589 nm).

3. The above-mentioned negative type photosensitive resin composition wherein the safelight is given from a discharge lamp containing sodium as a main component (which consists mainly of a D-ray having a light wavelength of 589 nm), and in the safelight, an energy light in a low wavelength region other than the D-ray is cut.

4. A method for forming a resist pattern which comprises steps of (1) applying a negative type photosensitive resin composition onto a substrate to form a photosensitive film thereon, (2) exposing the surface of the photosensitive film formed on the substrate to a laser beam directly or through a negative mask to cure the photosensitive film so that a desired resist pattern (an image) may be obtained on the surface of the photosensitive film, (3) subjecting the resist film formed in the above step (2) to a developing treatment to form the resist pattern on the substrate, wherein the negative type photosensitive resin composition is a liquid or a solid resin composition containing a photocurable resin, a photoreaction initiator and if necessary, a photosensitizing dye; an absorbancy of an unexposed film formed from this composition is 0.5 or less within the range of the maximum wavelength ±30 nm of a safelight having a maximum wavelength of an emission spectrum of a light source selected within the range of 500 to 620 nm and a high spectral luminous efficiency; and at least one step of the steps (1) to (3) is carried out under the irradiation circumstance of the safelight.

5. The method for forming the resist pattern wherein the safelight is given from a discharge lamp containing sodium as a main component (which consists mainly of a D-ray having a light wavelength of 589 nm).

According to the present invention, it is possible to form a resist pattern which is excellent in safe operativity, operational efficiency, the quality stability of products, and the like.

DETAILED DESCRIPTION OF THE PREFERRED EMBODIMENTS

Figure 5:
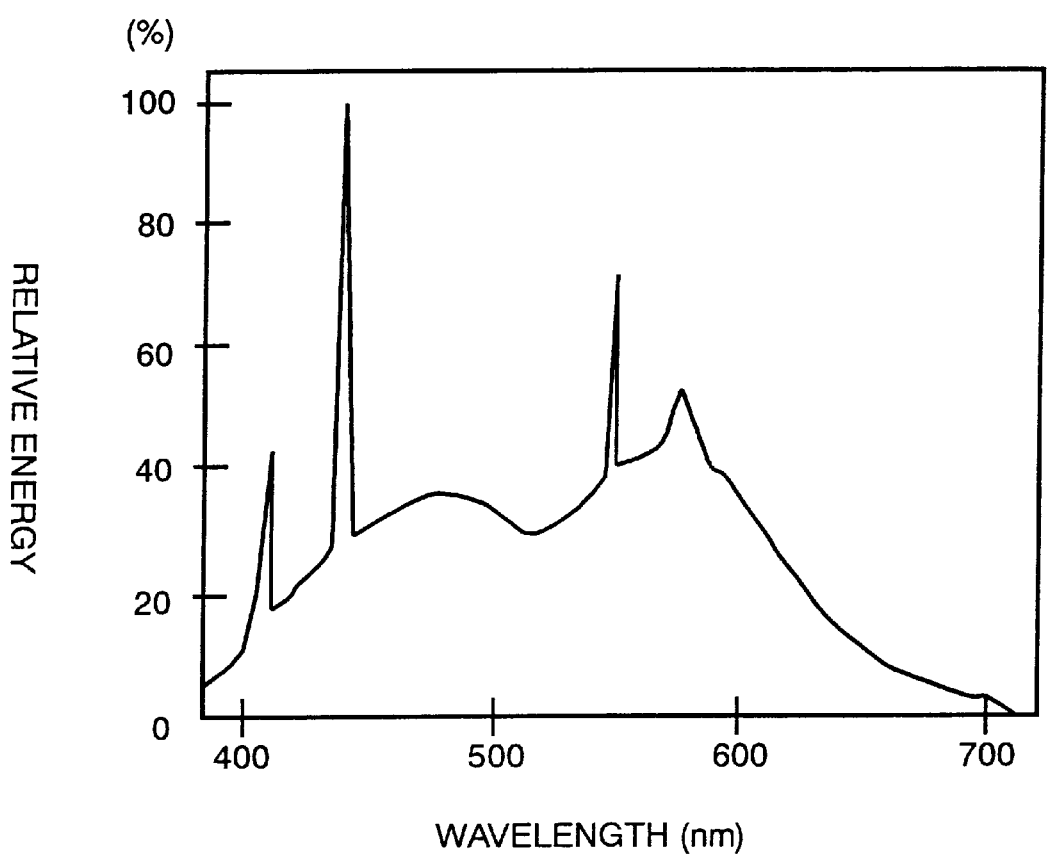
FIG. 5 is a graph showing a spectral distribution of a fluorescent lamp.

In the present invention, a light having a maximum wavelength in the range of 500 to 620 nm is a safelight which does not bring about a curing reaction of a specific negative type photosensitive resin composition, and the safelight in this range has a high relative visibility to workers. Accordingly, at the same illumination light intensity, this safelight seems to be much brighter as compared with a safelight for use in a conventional method. The present invention utilizes the characteristics of the above-mentioned safelight, whereby safe operativity, operational efficiency, the quality stability of products, and the like can be improved. Furthermore, as the safelight for use in the conventional method, a fluorescent lamp which is colored red has been used, but an emission spectrum of the fluorescent lamp has a wavelength range within a wide range of from an ultraviolet light to a visible light region (FIG. 5). Therefore, this fluorescent lamp cures even a portion of the photosensitive resin coating film which does not need to be cured, so that any clear resist pattern cannot be formed by a developing treatment. Lowering the intensity of the light, which inconveniently makes a working circumstance dark, compensates this drawback. On the contrary, in the present invention, there is employed the safelight, for example, a sodium lamp having a sharp wavelength, whereby the above-mentioned problem can be solved.

Figure 1:
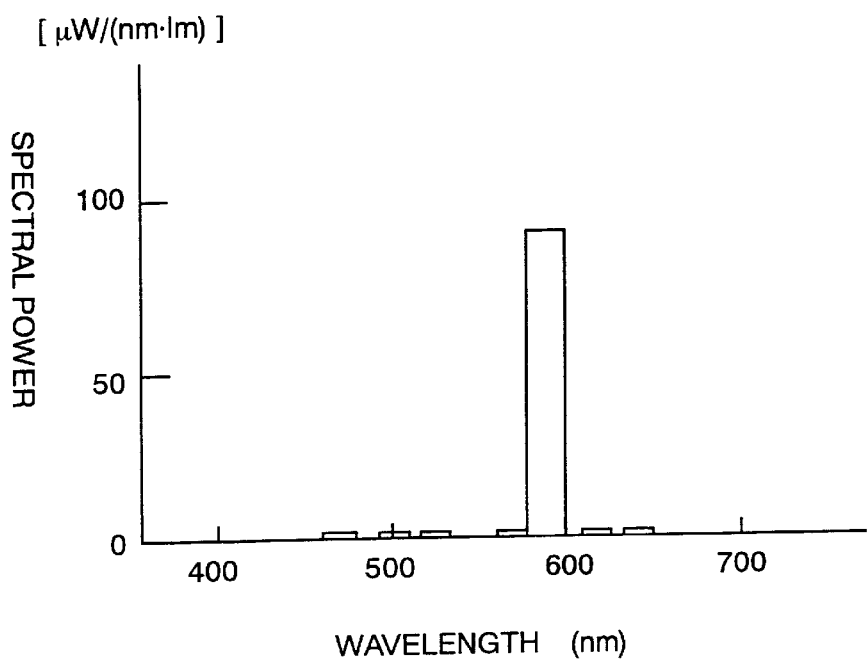
FIG. 1 is a graph showing one example of a spectral distribution of a discharge lamp for a safelight containing sodium as a main component which can be used in the present invention.
Figure 2:
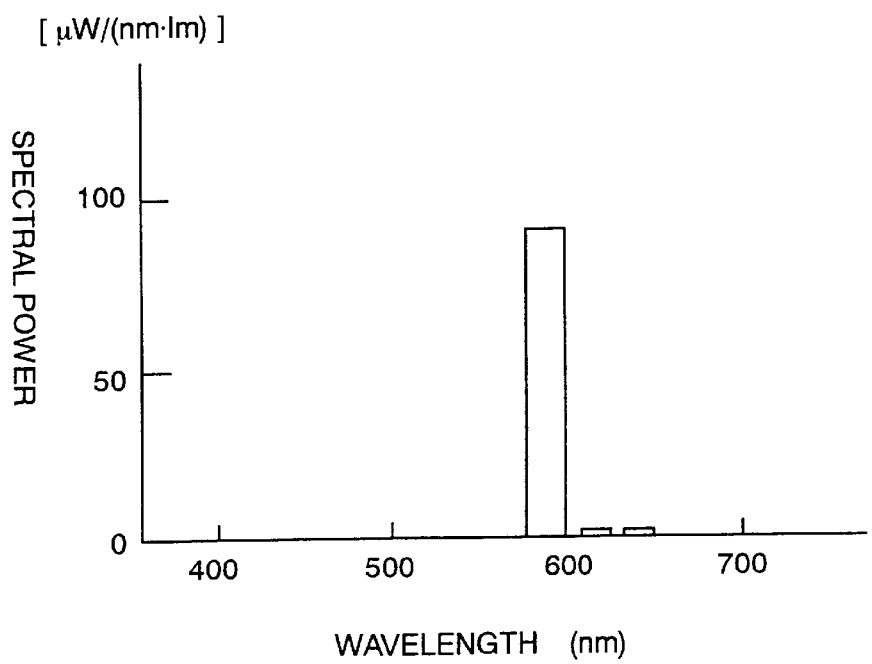
FIG. 2 is a graph showing a spectral distribution of the sodium discharge lamp in FIG. 1 to which a filter is attached.

The safelight for use in the present invention is a visible light having a high spectral luminous efficiency and a maximum wavelength selected within the range of 500 to 620 nm, preferably 510 to 600 nm. This safelight can be obtained, for example, by using a discharge lamp in which the light having the maximum wavelength in the above-mentioned range can be emitted by discharging the lamp itself in a gas such as sodium. Of various discharge lamps, the sodium lamp is excellent in safety properties, working circumstance properties and the like, because the light emitted from the sodium lamp consists mainly of a yellow D-ray having a wavelength of 589 nm and it is a monochromatic light, so that a chromatic aberration of the light is low and hence objects can be sharply displayed. FIG. 1 shows a spectral distribution diagram of the low-pressure sodium lamp. As shown in FIG. 1 regarding this spectral distribution diagram of the sodium lamp, in addition to the D-ray which is the maximum wavelength of the sodium lamp, the safelight may have a high-energy ray (a short-wavelength range) to such a degree as not to adversely affect the negative type photosensitive resin composition. Furthermore, light emitted from the sodium lamp equipped with a filter to cut the high-energy rays other than the D-ray can also be used as the safelight. The spectral distribution of the sodium lamp in which the high-energy ray is cut is shown in FIG. 2.

Moreover, for the safelight for use in the present invention, the filter can be used. Examples of the filter include "Fantac FD-1081 Scarlet", "Fantac FC-1431 Sunflower Yellow" (both of them are trade marks and made by Kansai Paint Co., Ltd.), and "Lintech Lumicool film No. 1905"(a trade mark, made by Lintech Co., Ltd.).

In addition, the safelight for use in the present invention is preferably a sharp monochromatic light of 589 nm such as the light from the sodium lamp, but in addition to the light having the maximum wavelength in the above-mentioned range, there may be used a safelight having a wavelength which is distributed in a wavelength range of an ultraviolet light, a visible light or an infrared light. However, when the safelight having such a distribution is used, this distributed light range is required to be the range of the safelight which does not have an adverse influence (sensitization) on the negative type photosensitive resin composition.

Such a safe high-energy light range is concerned with the distributed energy intensity of the light and the absorbancy of the negative type photosensitive resin composition in this range. When the energy intensity of the light is high, the composition having the low absorbency can be used, and when the energy intensity of the light is low, the composition having a relatively higher absorbency than the former can be used. However, a conventional fluorescent lamp having a maximum wavelength in the range of 500 to 620 nm cannot be used as the safelight for the negative type photosensitive resin composition which is to be sensitized by the visible laser having an oscillation line especially at 488 nm or 532 nm, because this type of fluorescent lamp has the high light energy in less than 500 nm, especially in 400 to 499 nm.

The absorbency defined in the present invention is represented by the formula of $-\log (I/I_0)$ wherein I is an intensity of the light transmitted through a coating film formed by applying the visible light curable resin composition onto the surface of a transparent substrate and then drying the same (removing the solvent); and $I_0$ is an intensity of the light transmitted through a blank {the transparent substrate (e.g., a polyethylene terephthalate sheet) onto which the sample (the negative type photosensitive resin composition) is applied}.

Figure 3:
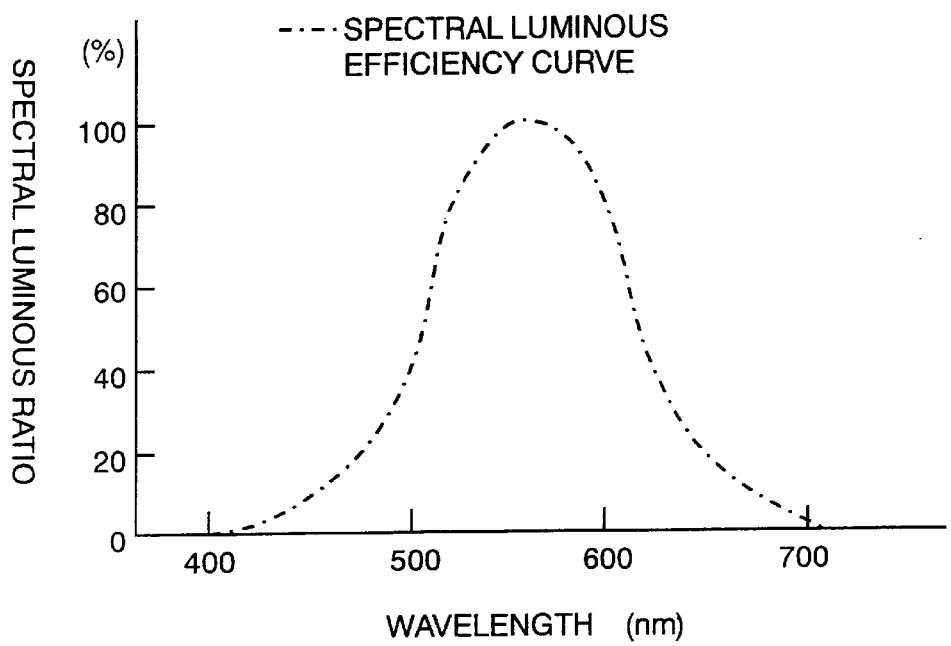
FIG. 3 is a graph showing a spectral luminous efficiency curve.

An extent of a light brightness which human eyes can perceive can be represented by the spectral luminous efficiency. As defined in JIS Z8113-2005, this spectral luminous efficiency can be defined as the reciprocal of a relative value of a radiation luminance of a monochromatic light having a wavelength λ when the brightness of the monochromatic light having the wavelength λ is judged to be equal to that of a reference for comparison under predetermined observational conditions, and usually, it can be defined as a value standardized so that the maximum value ay become 1 when the wavelength λ is varied. FIG. 3 shows a spectral luminous efficiency curve in the range of 380 to 780 nm that is the wavelength range of the visible light. In FIG. 3, the ratio of the spectral luminous efficiency is shown on the assumption that the maximum value of the spectral luminous efficiency on the ordinate axis is 100. It is apparent from this curve that in the range of 640 to 780 nm which is the conventional wavelength range of red, the spectral luminous efficiency is low and this range is perceived to be dark by human eyes, and for example, in order for the human eyes to perceive the same brightness as at a wavelength of 589 nm, the intensity of the irradiated light must be further increased. In addition, the maximum value of a luminosity is about 555 nm (JIS-Z8113 2008).

The negative type photosensitive resin composition for use in the present invention is a liquid or a solid resin composition containing a photocurable resin, a photoreaction initiator (e.g., a light radical polymerization initiator, a light acid generator and a light base generator) and if necessary, a photosensitizing dye, and a conventionally known composition can be used, so long as an absorbancy of an unexposed film formed from this composition is 0.5 or less, preferably 0.2 or less, more preferably 0.1 or less within the range of the central wavelength ±30 nm(−30 nm to +30 nm), preferably the maximum wavelength ±20 nm (−20 nm to +20 nm), or more preferably the maximum wavelength ±10 nm (−10 nm to +10 nm) of the maximum wavelength selected from the range of the maximum wavelength of the safelight.

No particular restriction is put on the photocurable resin which can be used in the present invention, so long as it is a photocurable resin having a photosensitive group which can crosslink by light irradiation. Examples of this kind of resin include monomers and prepolymers of compounds having at least one ethylenic unsaturated double bond, oligomers such as dimers and trimers thereof, mixtures thereof, and copolymers thereof. In addition to these compounds, other examples of the photocurable conventional known resin include a polyurethane resin, an epoxy resin, a polyester resin, a polyether resin, an alkyd resin, a polyvinyl chloride resin, a fluorinated resin, a silicone resin, a vinyl acetate resin, a novolak resin or a resin composition comprising two or more of these resins bonded to at least one photopolymerizable unsaturated group, and compounds in which a photopolymerizable unsaturated group is bonded to a modified resin comprising two or more of these resins. Examples of the photopolymerizable unsaturated group include an acryloyl group, a methacryloyl group, a vinyl group, a styryl group, an allyl group, a cinnamoyl group, a cinnamylidene group and an azide group.

As the above-mentioned photocurable resin, monofunctional and multifunctional (meth)acrylates are usually used, and examples of the photocurable resin include anionic photocurable resins having a (meth)acryloyl group as the photosensitive group, photocurable resins having a cinnamoyl group as the photosensitive group, and photocurable resins having an allyl group as the photosensitive group, which are mentioned in the passage of page 2, right lower column, line 6 to page 6, left lower column, line 16 of Japanese Patent Application Laid-Open No. 223759/1991. The photocurable resin is preferably used in combination with any of the light radical polymerization initiators mentioned hereinafter. These photocurable resins can be used singly or in the form of a mixture thereof. It is also possible to use polyethylene glycol di(meth)acrylate having a molecular weight of 300 to 1000 as a typical example of ester compounds of aliphatic polyhydroxy compounds and unsaturated carboxylic acids which are mentioned as ethylenic unsaturated compounds of a photocurable resin component (a2) in the above-mentioned publication.

In addition to the above-mentioned photocurable resins, there can be used compounds which can be cured (insolubilized) by a reaction such as polymerization, etherification, pinacol rearrangement, silanol dehydrogenation, intramolecular dehydration condensation or hydrolytic condensation in the presence of an acid, as a catalyst, generated from the light acid generator. Examples of these compounds include glycidyl ether type epoxy compounds such as bisphenol A type diglycidyl ether, (poly) ethylene glycol diglycidyl ether and trimethylolpropane diglycidyl ether; alicyclic epoxy compounds such as 3,4-epoxycyclohexyl -methyl-3,4-epoxycyclohexane carboxylate, dicyclopentadiene dioxide, epoxycyclohexenecarboxylic acid ethylene glycol diester and 1,3-bis{2-[3(7-oxabicyclo[4.1.0]heptyl)]ethyl}-tetramethyldisiloxane (refer to J. Polym. Sci., Part A, Polym. Chem., Vol. 28, p. 479, (1990)); vinyl ether compounds such as butylene glycol divinyl ether, trimethylolpropane di(1-propenyl)methyl ether, trimethylolpropane di(1-propenyl)butyl ether, trimethylolpropane di(1-propenyl)octyl ether, trimethylolpropane di(1-propenyl)-phenyl ether, trimethylolpropane di(1-propenyl) ether acetate, trimethylolpropane di(1-propenyl) ether acrylate and trimethylolpropane di(1-propenyl)N-butyl carbonate (refer to J. Polym. Sci., Part A, Polym. Chem., Vol. 34, p. 2051, (1996)); alkoxy allene compounds such as dodecyl allene (DA), diethylene glycol diallene (DEGA), triethylene glycol diallene (TEGA), 1-tetrahydrofurfuryl allene ether (THFA), N-hexyloxy-1,2-propadiene (HA), 1,4-di-N-butoxy-1,2-butadiene (DBB), 1,4-diethoxy-1,2-butadiene and N-hexylpropazyl ether (HPE) (refer to J. Polym. Sci., Part A, Polym. Chem., Vol. 33, p. 2493, (1995)); oxetane compounds such as 3-ethyl-3-phenoxymethyl-oxetane, phenoxymethy-loxetane, methoxymethyloxetane and 3-methyl-3-methoxy-methyloxetane (refer to J. Polym. Sci., Part A, Polym. Chem., Vol. 33, p. 1807 (1995)); ketene acetal compounds such as 2-propylidene-4,5-dimethyl-1,3-dioxolane, 2-propylidene-4-methyl-1,3-dioxolane and 3,9-dithilidene -2,4,8,10-tetraoxaspiro[5.5]undecane, (refer to J. Polym. Sci., Part A, Polym. Chem., Vol. 34, p. 3091 (1996)); bicycloortho ester compounds such as 1-phenyl-4-ethyl-2,6,7-trioxabicyclo [2.2.2]octane (refer to J. Polym. Sci., Polym. Lett. Ed., Vol. 23, p. 359, (1985)); lactone compounds such as propiolactone, butylolactone, γ-valero-lactone, γ-caprolactone, γ-caprylolactone, γ-lauryrolactone and coumarin; aromatic vinyl compounds such as methoxy-α-methylstyrene; heterocyclic vinyl compounds such as vinyl-carbazole; melamine compounds such as hexamethylol melamine and hexamethoxy melamine; a copolymer of p-vinylphenol and p-vinylbenzyl acetate; and other aromatic compounds such as trimethylolbenzene and tri (acetoxycarbonylmethyl)benzene. These compounds may have a polymeric structure, so long as they can be cured by a proton of an acid.

It is also possible to use compounds which can be cured (insolubilized) by polymerization or polycondensation under the catalytic function of a base generated from the light base generator, for example, compounds having at least one functional group such as an epoxy group or a silanol group.

In addition to the above-mentioned compounds which can be cured by the catalyst generated from the light acid generator or the light base generator, conventional known resins can be blended as needed, and examples of these resins include an acrylic resin, a vinyl resin, a polyester resin, an alkyd resin, an epoxy resin, a phenol resin, a rubber and an urethane resin.

As the photoreaction initiator which can be used in the present invention, there can be used a light radical polymerization initiator, a light acid generator and a light base generator.

As the light radical polymerization initiator, there can be used conventional known compounds which can adjust the absorbancy of the unexposed film to 0.5 or less in the range of the central wavelength ±30 nm of the maximum wavelength of the safelight having the maximum wavelength selected from the above-mentioned range. Examples of these compounds include aromatic carbonyl compounds such as benzophenone, benzoin methyl ether, benzoin isopropyl ether, benzyl xanthone, thioxanthone and anthraquinone; acetophenones such as acetophenone, propiophenone, α-hydroxyisobutylphenone, α,α'-dichloro-4-phenoxyacetophenone, 1-hydroxy-1-cyclohexylacetophenone and diacetylacetophenone; organic peroxides such as benzoyl peroxide, t-butylperoxy-2-ethylhexanoate, t-butylhydro-peroxide, di-t-butyldiperoxyisophthalate and 3,3',4,4'-tetra(t-butylperoxycarbonyl)benzophenone; diphenylhalonium salts such as diphenyl iodobromide and diphenyl iodochloride; organic halides such as carbon tetrabromide, chloroform and iodoform; heterocyclic and polycyclic compounds such as 3-phenyl-5-isooxazorone and 2,4,6-tris(trichloromethyl)-1,3,5-triazinebenzanthrone; azo compounds such as 2,2'-azo(2,4-dimethylvaleronitrile), 2,2-azobisisobutyronitrile, 1,1'-azobis(cyclohexane-1-carbonitrile) and 2,2'-azobis(2-methylbutyronitrile); iron-arene complexes (refer to European Patent No. 152377); titanocene compounds (refer to Japanese Patent Application Laid-Open No. 221110/1988); bisimidazole compounds; N-arylglycidyl compounds; acridine compounds; combinations of aromatic ketones and aromatic amines; and peroxyketals (refer to Japanese Patent Application Laid-Open No. 321895/1994). Of the above-mentioned light radical polymerization initiators, di-t-butyl diperoxyisophthalate, 3,3'14,4'-tetra(t-butylperoxycarbonyl)-benzophenone, the iron-arene complexes and the titanocene compounds are preferable, because they have a high activity to crosslinking or polymerization.

In addition, commercially available light radical polymerization initiators can also be used, and examples of these initiators include "Illugacure™651" (trade name, made by Ciba-Geigy, acetophenone-containing photoradical polymerization initiator), "Illugacure™184" (trade name, made by Ciba-Geigy, acetophenone-containing photoradical polymerization initiator), "Illugacure™1850" (trade name, made by Ciba-Geigy, acetophenone-containing photoradical polymerization initiator), "Illugacure™907" (trade name, made by Ciba-Geigy, aminoalylphenone-containing photoradical polymerization initiator), "Illugacure™369" (trade name, made by Ciba-Geigy, aminoalylphenone-containing photoradical polymerization initiator), "Rusilin™TPO" (trade name, made by BASF Co., Ltd., 2,4,6-trimethylbenzoyldiphenylphosphine oxide), "Kayacure™DETXS" (trade name, made by Nippon Kayaku Co., Ltd.), and CGI-784 (trade name, made by Ciba-Geigy, titanium complex compound).

These radical polymerization initiators can be used singly or in a combination of two or more thereof.

Furthermore, the light acid generator is a compound which can generate an acid by exposure, and this generated acid is used as a catalyst to cure the above-mentioned compound. As the light radical polymerization initiator, there can be used conventional known compounds which can adjust the absorbancy of the unexposed film to 0.5 or less in the range of the central wavelength ±30 nm of the maximum wavelength of the safelight having the maximum wavelength selected from the above-mentioned range. The light acid generator which have usually been used can be employed in the present invention, so long as it can meet the above-mentioned conditions. Typical examples of the light acid generator include onium salts such as sulfonium salts, ammonium salts, phosphonium salts, iodonium salts and selenium salts, iron-arene complexes, silanol-metal chelate complexes, triazine compounds, diazidonaphthoquinone compounds, sulfonic acid esters and sulfonic acid imide esters. In addition to the above-mentioned compounds, it is also possible to use the light acid generators mentioned in Japanese Patent Application Laid-Open No. 146552/1995 and Japanese Patent Application No. 289218/1997.

Moreover, the light base generator is a compound which can generate a base by exposure, and this generated base is used as a catalyst to cure the above-mentioned compound. As the light radical polymerization initiator, there can be used conventional known compounds which can adjust the absorbancy of the unexposed film to 0.5 or less in the range of the central wavelength ±30 nm of the maximum wavelength of the safelight having the maximum wavelength selected from the above-mentioned range. The light base generator which have usually been used can be employed in the present invention, so long as it can meet the above-mentioned conditions. Typical examples of the light base generator include nitrobenzylcarbamate compounds such as [(o-nitrobenzyloxy)carbonyl]cyclohexylamine (refer to J. Am. Chem. Soc., Vol. 113, No. 11, p. 4305 (1991)) and photo-functional urethane compounds such as N-[[1-(3,5-dimethoxyphenyl)-1-methyl-ethoxy]carbonyl] cyclohexylamine and N-[[1-(3,5-dimethoxyphenyl)-1-methyl-etoxy]carbonyl]-pyridine (refer to J. Org. Chem., Vol. 55, No. 23, p. 5919, (1990)).

A blend ratio of the photoreaction initiator is in the range of 0.1 to 25 parts by weight, preferably 0.2 to 10 parts by weight with respect to 100 parts by weight of the photocurable resin.

To the visible light curable resin composition of the present invention, some additives can be added, as needed. Examples of the additives include an adhesion improver, a polymerization inhibitor such as hydroquinone, 2,6-di-t-butyl-p-cresol or N,N-diphenyl-p-phenylenediamine, a rubber, fine particles of an organic resin such as a vinyl polymer or a vinyl polymer having an unsaturated group, a pigment such as a coloring pigment or an extender pigment, a metal oxide such as cobalt oxide, a plasticizer such as dibutyl phthalate, dioctyl phthalate, tricresyl phosphate, polyethylene glycol or polypropylene glycol, a cissing inhibitor and a fluidity adjuster.

The above-mentioned adhesion improver is mixed to improve the adhesion of the coating film to a substrate, and examples of the adhesion improver include tetrazoles such as tetrazole, 1-phenyltetrazole, 5-aminotetrazole, 5-amino-1-methyltetrazole, 5-amino-2-phenyltetrazole, 5-mercapto-1-phenyltetrazole, 5-mercapto-1-methyltetrazole, 5-methylthiotetrazole and 5-chloro-1-phenyl-1H-tetrazole.

In addition to the above-mentioned photoreaction initiator, there can be used conventional known photosensitizing agents which can adjust the absorbancy of the unexposed film to 0.5 or less in the range of the central wavelength ±30 nm of the maximum wavelength of the safelight having the maximum wavelength selected from the above-mentioned range. Examples of the photosensitizing agents include the dyes of thioxanthenes, xanthenes, ketones, thiopyrylium salts, base styryls, merocyanines, 3-substituted coumarins, 3,4-substituted coumarins, cyanines, acridines, thiazines, phenothiazines, anthracenes, coronenes, benzanthracenes, perillenes, merocyanines, ketocoumarins, fumarines, borates and the like. These dyes can be used singly or in a combination of two or more thereof. Examples of the borate photosensitizing dyes include dyes mentioned in Japanese Patent Application Laid-Open Nos. 241338/1993, 5685/1995 and 225474/1995.

If necessary, the negative type photosensitive resin composition which can be used in the present invention can contain a photopolymerizable unsaturated compound (resin) other than mentioned above, in addition to the above-mentioned components. Examples of the photopolymerizable unsaturated compound include methyl (meth)acrylate, ethyl (meth)acrylate, butyl (meth)acrylate, 2-ethylhexyl (meth)acrylate, (poly)ethylene glycol di(meth)acrylate, (poly)propylene glycol tri(meth)acrylate, trimethylolpropane tri(meth)acrylate, glycerin tri(meth)acrylate, pentaerythritol tetra(meth)acrylate and pentaerythritol tri(meth)acrylate.

The amount of the other photopolymerizable unsaturated compound to be used is preferably in the range of about 0 to 40% by weight, more preferably about 5 to 50% by weight with respect to the total weight of the composition (solid content).

The photosensitive resin composition of the present invention can be used for a variety of applications as known photosensitive materials such as coating compositions, inks, adhesives, resist materials, printing plate materials (printing materials for planography and letterpress, and presensitized plates for offset lithography), information recording materials, and materials for relief images.

The dry film thickness (exclusive of the solvent) formed from the visible light curable resin composition of the present invention is set so that the absorbency of the unsensitized coating film formed from this composition may be 0.5 or less in the range of the central wavelength ±30 nm of the maximum wavelength of the safelight having the maximum wavelength selected from the above-mentioned range, but from a practical viewpoint, it is usually in the range of 0.5 to 50 μm, preferably 1 to 30 μm. Furthermore, the absorbency depends on kinds and amounts of the photoreaction initiator, the photosensitizer and the like contained in the composition, and even in the case of the same composition, it also depends on the thickness of the coating film. That is to say, in the same composition, when the thickness of the coating film increases, the concentrations of the photoreaction initiator, the photosensitizer and the like contained in the coating film increase, so that the absorbency increases. On the other hand, when the thickness of the coating film decreases, the concentrations of the above-mentioned components contained in the coating film decrease, so that the absorbency decreases. It is apparent from the foregoing that the absorbency can be adjusted so as to be within the above-mentioned range by adjusting the thickness of the coating film to be formed.

The photosensitive resin composition of the present invention can be used as an organic solvent type photosensitive resin composition or an aqueous photosensitive resin composition.

The above-mentioned organic solvent type photosensitive resin composition is an organic solvent type photosensitive resin composition obtained by dissolving or dispersing a blend of a photocurable resin, a photoreaction initiator and if necessary, a photosensitizer (a dye) in an organic solvent (a ketone, an ester, an ether, a cellosolve, an aromatic hydrocarbon ring, an alcohol or a halogenated hydrocarbon). This composition is applied onto a substrate (e.g., a metal such as aluminum, magnesium, copper, zinc, chromium, nickel or iron, an alloy sheet containing the metal as a component, or a printed board, a plastic, a glass or a silicon wafer surface-treated with the above-mentioned metal, or carbon) by means of a roller, a roll coater, a spin coater, a curtain roll coater, a spray, electrostatic coating, immersion coating or silk screen printing, and if necessary, setting is carried out, followed by drying to obtain a photosensitive material (film).

Furthermore, the surface of the photosensitive material can be previously covered with a cover coat layer prior to being cured by exposure to the visible light. This cover coat layer is formed for the purpose of blocking oxygen in air to prevent radicals generated by the exposure from being inactivated by the oxygen, and for the purpose of smoothly advancing the curing of the coating film by the exposure.

This cover coat layer can be formed, for example, by covering the surface of the applied coating film with a resin film (film thickness=about 1 to 70 μm) of a polyester resin such as polyethylene terephthalate, an acrylic resin, a polyethylene, a polyvinyl chloride resin or the like; or by applying, onto the surface of the applied coating film, an aqueous solution prepared by dissolving or dispersing an aqueous resin (dry film thickness=about 0.5 to 5 μm) in water and then drying it. In this case, examples of the aforesaid aqueous resin include polyvinyl alcohol, a partially saponificated compound of polyvinyl acetate, a copolymer of polyvinyl alcohol and vinyl acetate, a copolymer of the partially saponificated compound of polyvinyl acetate and vinyl acetate, polyvinyl pyrrolidone, a water-soluble polysaccharide polymer such as pullulan, and an acrylic resin, a polyester resin, a vinyl resin and an epoxy resin containing a basic group, an acidic group or a base. This cover coat layer is preferably removed after the exposure of the photosensitive material surface and before the developing treatment. This cover coat layer of the water-soluble polysaccharide polymer or the aqueous resin can be removed, for example, with a solvent such as water, an acidic aqueous solution or a basic aqueous solution in which the resin can be dissolved or dispersed.

The above-mentioned aqueous photosensitive resin composition can be obtained by dissolving or dispersing the blend of the photocurable resin, the photoreaction initiator and if necessary, the photosensitizer in water. This kind of composition can be handled similarly to a usual photosensitive material for electrodeposition coating, and so it can be used as a coating composition for the electro-deposition coating. The aqueous dispersion or the aqueous solution of the aqueous photosensitive resin composition can be formed by neutralizing the composition with an alkali (a neutralizer) when an anionic group such as a carboxyl group is introduced in the photosensitive resin composition, or neutralizing it with an acid (a neutralizer) when a cationic group such as an amino group is introduced therein.

Examples of the above-mentioned alkali neutralizer include monoethanolamine, diethanolamine, triethylamine, diethylamine, dimethylaminoethanol, cyclohexylamine and ammonia. Furthermore, examples of the acid neutralizer include acetic acid, propionic acid, lactic acid, hydrochloric acid, sulfuric acid, phosphoric acid, formic acid and crotonic acid. The amount of the neutralizer to be used is usually in the range of 0.2 to 1.0 equivalent, preferably 0.3 to 0.8 equivalent per equivalent of the ionic group contained in the photosensitive resin composition.

The above resin containing the ionic group is such that a carboxyl group is preferably in the range of about 30 to 700 mg KOH/g, more preferably 40 to 600 mg KOH/g in terms of an acid value of the resin. If the acid value is less than about 30 mg KOH/g, the removal of the uncured film by the treatment with a developing solution is poor, and for example, when the photosensitive composition is applied to a printed circuit board, copper cannot be sufficiently removed in the next etching step on occasion. On the other hand, when the acid value is more than about 700 mg KOH/g, a resist film portion (a cured film portion) is easily separated, so that a satisfactory copper circuit cannot be formed inconveniently sometimes. Moreover, the amino group is such that an amine value is preferably in the range of about 20 to 650, more preferably about 30 to 600. If the amine value is less than about 20, copper cannot sufficiently be removed in the etching step, and other the other hand, if the amine value is more than 650, the resist film is easily removed inconveniently sometimes.

As the electrodeposition coating composition, there can be used, for example, a cationic electrodeposition coating composition having a pH of 4 to 7 or an anionic electrodeposition coating composition having a pH of 7 to 9 in which a bath concentration (a solid content concentration) is adjusted to the range of 3 to 25% by weight, preferably 5 to 15% by weight.

The electrodeposition coating composition can be applied onto the surface of a conductor which is a material to be coated in the following manner. That is to say, the pH and the concentration of the bath are first adjusted to be within the above-mentioned ranges, and the bath temperature is then controlled so as to be in the range of 15 to 40° C., preferably 15 to 30° C. Next, a DC voltage of 5 to 200 V is applied to the thus controlled electrodeposition bath, while the conductor to be coated is immersed in the bath as an anode when the electrodeposition coating composition is an anionic type, or as a cathode when the electrodeposition coating composition is a cationic type. A voltage application time is suitably in the range of 10 seconds to 5 minutes.

As the electrodeposition coating technique, there can also be carried out a method of applying an electrodeposition coating composition having a low glass transition temperature to the material to be applied, washing it with water, or washing it with water and drying, and then applying another electrodeposition coating composition having a glass transition temperature of 20° C. or more (refer to Japanese Patent Application Laid-Open No. 20873/1990), i.e., a method of conducting a double-coat electrodeposition coating.

The thickness of the obtained coating film is usually in the rage of 0.5 to 50 $\mu$m, preferably 1 to 15 $\mu$m in terms of the dry coating film thickness.

After the electrodeposition coating, the applied substrate is taken out of the electrodeposition bath, washed with water, and then dried with hot air to remove water content from the electrodeposited coating film. Examples of the usable conductor include conductive materials such as metals, carbon and tin oxides as well as plastics and glasses whose surfaces are fixedly covered with these conductive materials by lamination, plating or the like.

Furthermore, a cover coat layer may be previously formed on the surface of the electrodeposited coating film prior to the exposure and the curing with the visible light. Examples of this cover coat layer include the materials mentioned above. The cover coat layer is preferably removed before the electrodeposited coating film is subjected to the developing treatment. The cover coat layer comprising the water-soluble polysaccharide polymer or the aqueous resin can be removed with, for example, a solvent such as water, an acidic aqueous solution or a basic aqueous solution which can dissolve or disperse the used resin.

In addition to the above-mentioned use applications, for example, the photosensitive resin composition of the present invention can be applied onto a transparent resin film of a polyester resin such as polyethylene terephthalate, an acrylic resin, a polyethylene, a polyvinyl chloride resin or the like which becomes a base film layer by the use of a roll coater, a blade coater or a curtain coater, followed by drying to form a resist film (the dry film thickness=about 0.5 to 5 $\mu$m). Afterward, a protective film is then laminated on this coating film to obtain a dry film resist.

From such a dry film resist, the protective film can be peeled off, and the dry film resist can be then laminated on a support so that the dry film resist may come in contact with the support by a means such as thermocompression bonding, thereby forming the resist film. After the base film is peeled off or without the peeling, the resist film can be exposed to the visible light and then cured in accordance with an image in the same manner as in the case of the above-mentioned electrodeposition coating. When the base film is present, this base film is peeled off, and when it is not present, a developing treatment can be directly carried out, thereby forming the image. Furthermore, in the dry film resist, the above cover coat layer can be formed between the base film layer and the resist film, when needed. This cover coat layer may be formed by its application or by its adhesion onto the resist film. The cover coat layer may be removed or need not be removed prior to the developing treatment.

As for a light source of activation energy rays for curing the negative type photosensitive resin composition of the present invention, conventional known activation energy rays can be used without any particular restriction, so long as they can irradiate the activation energy rays necessary to cure the composition. Examples of the light source which can emit the visible light include an ultra-high pressure, a high pressure, an intermediate pressure or a low pressure mercury-vapor lamp, a chemical lamp, a carbon-arc lamp, a xenon lamp, a metal halide lamp and a tungsten lamp. Moreover, there can also be used various lasers having an oscillation line in the visible light range in which an ultraviolet light is cut from the above-mentioned light sources through an ultraviolet light cut filter. Above all, the laser having the oscillation line in the visible light range such as an argon laser (488 nm) or a YAG-SHG laser (532 nm) is preferable.

The negative type photosensitive resin composition of the present invention does not increase any viscosity on a substrate such as a plastic sheet, a metal, a glass, a paper or a lumber under the irradiation circumstance conditions of this safelight, so that coating and printing can be carried out under the bright circumstance conditions. In addition, the composition is preferably used as the negative type photosensitive resin composition for the formation of the resist pattern coating film.

Next, a procedure of forming the resist pattern on the substrate by the use of this negative type photosensitive resin composition will be described as follows:

(1) The negative type photosensitive resin composition is applied onto the substrate to form a photosensitive film thereon, and (2) the surface of the applied photosensitive film is exposed to a laser beam directly or a light through a negative mask to cure the photosensitive film so that a desired resist film (an image) may be obtained on the surface of the photosensitive film. Next, (3) an uncured portion of the photosensitive film is then developed with an alkaline or an acidic aqueous solution to form a resist pattern on the substrate. Furthermore, when the composition is applied to a printed circuit board, a copper layer portion which is not protected by the patterned resist film is removed by etching, and the resist film is further removed to obtain a desired wiring pattern.

Examples of the above substrate include plastic films and plastic plates such as electrically insulating glass-epoxy plates, polyethylene terephthalate films and polyimide films; these plastic plates and plastic films on which a conductive film is formed by allowing a metal foil of copper or aluminum to adhere to the surface thereof, or by subjecting them to vacuum deposition, chemical deposition or plating by the use of a metal such as copper, nickel or silver, or a compound such as a conductive oxide typified by indium-tin oxide (ITO); plastic plates and plastic films provided with through-holes in which the surfaces and the through-holes are covered with a conductive film; and metallic plates such as copper plates.

In the above-mentioned application step (1), when the negative type photosensitive resin composition is an organic solvent system, this composition is applied onto the surface of the substrate by means of spray coating, electrostatic coating, spin coating, immersion coating, roller coating, curtain flow coating or silk screen printing, and if necessary, setting is carried out, followed by drying the substrate at a temperature in the range of about 50 to 130° C. to obtain the photosensitive resin film. The thus formed film is next exposed in step (2), and if necessary, for the purpose of blocking the surface of the film from oxygen to prevent the disadvantageous curing of the photosensitive film by the exposure, a conventional known non-photosensitive cover coat layer can be formed on the film.

Furthermore, when the negative type photosensitive resin composition is an electrodeposition coating composition, the composition is electrodeposited, drained, air-blown, and if necessary, dried at a temperature of about 50 to 130° C. to form the negative type photosensitive resin film.

The thickness of the thus formed negative type photosensitive resin film is preferably in the range of about 0.5 to 100 $\mu$m, more preferably about 1 to 50 $\mu$m.

As a light beam for use in the exposure step (2), a light emitted from the above-mentioned light source can be used, and particularly, a visible light in which the wavelength of an emission spectrum is 488 nm (argon laser) or 532 nm (YAG-SHG laser) has been put to practical use, and the employment of this kind of visible light is preferable, but it is not limited.

In the developing treatment (3), when an anionic group-containing resin is used in the negative type photosensitive resin composition, the uncured film was washed out with, usually, a weak alkaline aqueous solution prepared by diluting caustic soda, sodium carbonate, caustic potash, ammonia or an amine with water. Furthermore, when a cationic group-containing resin is used in the negative type photosensitive resin composition, the uncured film was washed out with, usually, a weak acidic aqueous solution prepared by diluting hydrochloric acid, sulfuric acid, phosphoric acid, acetic acid, silicic acid, formic acid or lactic acid with water. In the case that the cover coat is formed, it is preferred that this cover coat is removed prior to the developing treatment. At least one step of the above steps (1) to (3) should be carried out under the irradiation circumstance conditions of the safelight (preferably a sodium lamp) having a maximum wavelength-in the range of 550 to 620 nm.

Furthermore, in the case that the above substrate is an etching resist substrate, an exposed copper layer (a non-circuit portion) can be next etched and removed with an aqueous solution of ferric chloride or cupric chloride. In addition, the resist film can be removed with a solvent, e.g., a strong alkali such as caustic soda or methylene chloride.

The thus obtained substrate on which the resist pattern is formed can be used for decoration, or as a solder resist substrate or an etching resist substrate.

The present invention will be described in more detail in accordance with examples. Incidentally, "part(s)" in the examples and comparative examples means "part(s) by weight".

EXAMPLE 1

(Preparation Example of Photosensitive Solution)

A photosensitive solution was prepared by blending 100 parts (solid content) of a photocurable resin (a polymeric binder, resin solid content=55% by weight, propylene glycol monomethyl ether organic solvent, resin acid value=50 mg KOH/g, number average molecular weight=about 20000) obtained by reacting acrylic resin (resin acid value=155 mg KOH/g, methyl methacrylate/butyl acrylate/acrylic acid=40/40/20 weight ratio) with 24 parts by weight of glycidyl methacrylate, 1 part of a photoreaction initiator (trade name CGI-784, made by Ciba-Geigy, a titanocene compound), and 1 part of a photosensitizer (trade name LS-148, made by Mitsui Chemicals, Inc., a coumarin dye compound).

This photosensitive solution was applied onto a copper plated and glass fiber reinforced epoxy substrate in a dark room by a bar coater so that a dry film thickness might be 5 $\mu$m, followed by drying at 60° C. for 10 minutes to form a resist film. Afterward, onto the surface of this resist film, a 12% aqueous solution of polyvinyl alcohol (a cover coat layer) was applied by the bar coater so that a dry film thickness might be 3 $\mu$m, followed by drying at 60° C. for 10 minutes to form the substrate having the resist film.

Next, the surface of the substrate having the resist film obtained above was irradiated with a sodium lamp shown in FIG. 1 for 24 hours so that an illuminance intensity might be 40 lux. Next, this substrate was heated at 120° C. for 30 seconds in the dark room, and then immersed at 30° C. for 1 minute in a 1% aqueous sodium carbonate solution as a developing solution. As a result, the resist film was completely dissolved in the aqueous sodium carbonate solution, which meant that photocuring by the irradiation with the sodium lamp did not occur at all conveniently.

Moreover, the substrate having the resist film was irradiated with an argon laser having an intensity of 1 mJ/m$^2$ in the presence of an illuminance intensity of 40 lux by the sodium lamp through a negative mask for a printed substrate, and it was then immersed at 30° C. for 1 minute in a 1% aqueous sodium carbonate solution as the developing solution, followed by drying. As a result, an excellent printed resist image film was obtained. Also by the irradiation with a xenon lamp (an ultraviolet light wavelength range was cut) and second harmonic (532 nm) of a YAG-SHG laser, similar results could be obtained.

Figure 4:
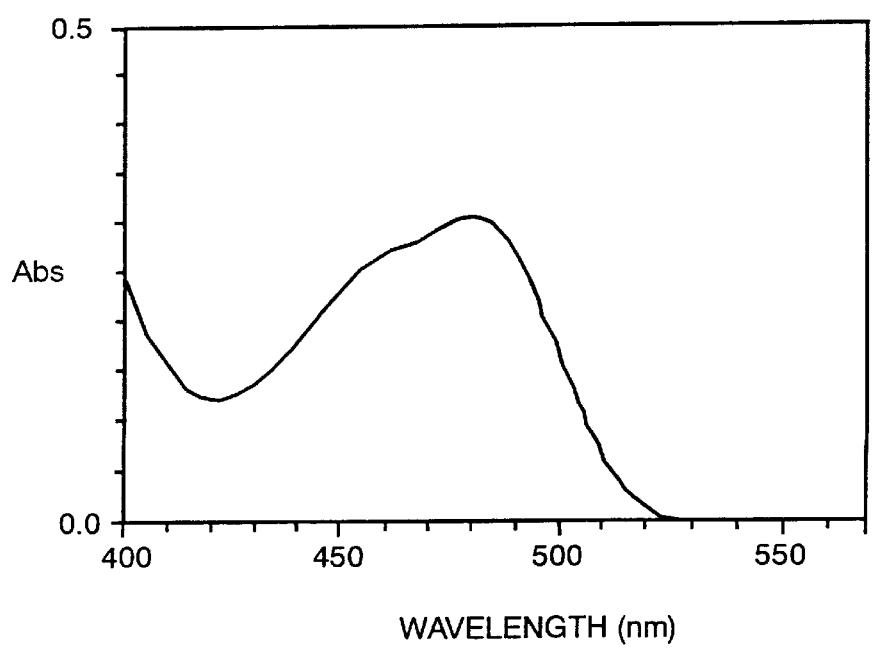
FIG. 4 shows an absorbancy curve of a resist film used in Example 1.

The above-mentioned photosensitive solution was applied onto a transparent polyethylene terephthalate sheet by the bar coater so that a film thickness might be 5 $\mu$m, followed by drying at 60° C. for 10 minutes, and an absorbency of the resultant film was then measured. The results are shown in FIG. 4. In this drawing, the ordinate axis and the abscissa axis denote the absorbency and a wavelength nm, respectively. In FIG. 4, the absorbency of the film in the wavelength of 570 nm or more on the abscissa axis was 0.00.

On an absorbency curve in FIG. 4 and in the range of 559 nm to 619 nm present in the range of a maximum wavelength 589 nm ±30 nm in FIG. 1, the absorbency of the film was 0.0 or less, and it is apparent that the safelight does not have a bad influence on the photosensitive solution.

EXAMPLE 2

A photosensitive solution having about the same composition as in Example 1 was prepared by the use of a mixture of 50 parts of the photocurable resin used in Example 1 and 50 parts of an acrylic resin (a) (a radical copolymer of methyl acrylate/styrene/acrylic acid =60/30/10 weight ratio, acid value=about 80, number-average molecular weight= 20000) in place of 100 parts of the photocurable resin in Example 1. This photosensitive solution was used and the same procedure as in Example 1 was conducted to form a resist film.

Next, the surface of the substrate having the resist film (dry film thickness=5 $\mu$m) obtained above was irradiated with a sodium lamp shown in FIG. 1 for 24 hours so that an illuminance intensity might be 40 lux. Afterward, this substrate was heated at 120° C. for 30 seconds in a dark room, and then immersed at 30° C. for 1 minute in a 1% aqueous sodium carbonate solution as a developing solution. As a result, the resist film was completely dissolved in the aqueous sodium carbonate solution, which meant that photocuring by the irradiation with the sodium lamp did not occur at all conveniently.

Moreover, the substrate having the resist film was irradiated with an argon laser having an intensity of 1 mJ/m$^2$ in the presence of an illuminance intensity of 40 lux by the sodium lamp through a negative mask for a printed substrate, and it was then immersed at 30° C. for 1 minute in a 1% aqueous sodium carbonate solution as the developing solution, followed by drying. As a result, an excellent printed resist image film was obtained. Also by the irradiation with a xenon lamp (an ultraviolet light wavelength range was cut) and second harmonic (532 nm) of a YAG-SHG laser, similar results could be obtained.

EXAMPLE 3

A photosensitive solution having about the same composition as in Example 2 was prepared by the use of 50 parts of an oxetane compound represented by the following formula:

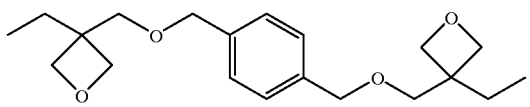

and 10 parts of a light acid generator represented by the following formula:

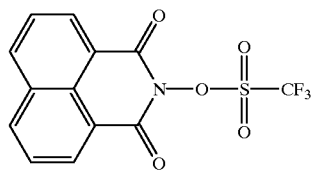

in place of 50 parts of the acrylic resin (a) and 1 part of the photopolymerizable initiator in Example 2. This photosensitive solution was used and the same procedure as in Example 1 was conducted to form a resist film.

Next, the surface of the substrate having the resist film (dry film thickness=5 $\mu$m) obtained above was irradiated with a sodium lamp shown in FIG. 1 for 24 hours so that an illuminance intensity might be 40 lux. Next, this substrate was heated at 120° C. for 30 seconds in a dark room, and then immersed at 30° C. for 1 minute in a 1% aqueous sodium carbonate solution as a developing solution. As a result, the resist film was completely dissolved in the aqueous sodium carbonate solution, which meant that photocuring by the irradiation with the sodium lamp did not occur at all conveniently.

Moreover, the substrate having the resist film was irradiated with an argon laser having an intensity of 1 mJ/m$^2$ in the presence of an illuminance intensity of 40 lux by the sodium lamp through a negative mask for a printed substrate, and it was then immersed at 30° C. for 1 minute in a 1% aqueous sodium carbonate solution as the developing solution, followed by drying. As a result, an excellent printed resist image film was obtained. Also by the irradiation with a xenon lamp (an ultraviolet light wavelength range was cut) and second harmonic (532 nm) of a YAG-SHG laser, the similar results could be obtained.

EXAMPLE 4

100 parts (solid content) of the photosensitive solution obtained in Example 2 were mixed with 7 parts of triethylamine, and after stirring, the mixture was then dispersed in deionized water to obtain an aqueous resin dispersion (solid content=15%). Anionic electrodeposition coating was carried out so that the thickness of a dry film might be 10 $\mu$m under conditions that the thus obtained aqueous resin dispersion was used as an electrodeposition coating bath and a laminated copper plate was used as an anode. Afterward, the plate having the film was washed with water, and then dried at 80° C. for 5 minutes to obtain an electrodeposited photosensitive layer. A 12% aqueous solution of polyvinyl alcohol was applied onto the surface of the thus formed photosensitive layer by a bar coater so that a dry film thickness might be 3 $\mu$m, followed by drying at 60° C. for 10 minutes to form a cover coat layer, and in consequence, the substrate having the resist film was prepared.

Next, the surface of the substrate having the resist film obtained above was irradiated with a sodium lamp shown in FIG. 1 for 24 hours so that an illuminance intensity might be 40 lux. Next, this substrate was heated at 120° C. for 30 seconds in a dark room, and then immersed at 30° C. for 1 minute in a 1% aqueous sodium carbonate solution as a developing solution. As a result, the resist film was completely dissolved in the aqueous sodium carbonate solution, which meant that photocuring by the irradiation with the sodium lamp did not occur at all conveniently.

Moreover, the substrate having the resist film was irradiated with an argon laser having an intensity of 1 mJ/m$^2$ in the presence of an illuminance intensity of 40 lux by the sodium lamp through a negative mask for a printed substrate, and it was then immersed at 30° C. for 1 minute in a 1% aqueous sodium carbonate solution as the developing solution, followed by drying. As a result, an excellent printed resist image film was obtained. Also by the irradiation with a xenon lamp (an ultraviolet light wavelength range was cut) and second harmonic (532 nm) of a YAG-SHG laser, the similar results could be obtained.

EXAMPLE 5

An addition reaction was carried out between 15 parts of acrylic acid and a radical copolymer of methyl acrylate/styrene/butyl acrylate/glycidyl methacrylate/dimethylaminoethyl methacrylate=20/10/22/30/18 weight ratio to obtain a photocurable resin (amine value=about 56, degree of unsaturation=1.83 mol/kg), and 100 parts of this photocurable resin was mixed with 0.5 part of the photosensitizer used in Example 1, 55 parts of trimethylolpropane triacrylate and 20 parts of the titanocene compound used in Example 1 to obtain a photosensitive solution. Next, 3 parts of acetic acid was blended with 100 parts (solid content) of this photosensitive solution, and the resultant blend was then dispersed in deionized water to obtain an aqueous resin dispersion (solid content=15%). Anionic electrodeposition coating was carried out so that the dry film thickness might be 10 $\mu$m under conditions that the thus obtained aqueous resin dispersion was used as an electrodeposition coating bath and a laminated copper plate was used as an anode. Afterward, the plate having the film was washed with water, and then dried at 80° C. for 5 minutes to obtain an electrodeposited photosensitive layer. A 12% aqueous solution of polyvinyl alcohol was applied onto the surface of the thus formed photosensitive layer by a bar coater so that a dry film thickness might be 3 $\mu$m, followed by drying at 60° C. for 10 minutes to form a cover coat layer, and in consequence, the substrate having the resist film was prepared.

Next, the surface of the substrate having the resist film obtained above was irradiated with a sodium lamp shown in FIG. 1 for 24 hours so that an illuminance intensity might be 40 lux. Afterward, this substrate was heated at 120° C. for 30 seconds in a dark room, and then immersed at 30° C. for 1 minute in a 2.38% aqueous tetramethylammonium hydroxide solution as a developing solution. As a result, the resist film was completely dissolved in the aqueous tetramethylammonium hydroxide solution, which meant that photocuring by the irradiation with the sodium lamp did not occur at all conveniently.

Moreover, the substrate having the resist film was irradiated with an argon laser having an intensity of 1 mJ/m² in the presence of an illuminance intensity of 40 lux by the sodium lamp through a negative mask for a printed substrate, and it was then immersed at 30° C. for 1 minute in a 2.38% aqueous tetramethylammonium hydroxide solution as the developing solution, followed by drying. As a result, an excellent printed resist image film was obtained. Also by the irradiation with a xenon lamp (an ultraviolet light wavelength range was cut) and second harmonic (532 nm) of a YAG laser, similar results could be obtained.

EXAMPLE 6

The same procedure as in Example 1 was conducted except that the sodium lamp in FIG. 1 was replaced with a sodium lamp in FIG. 2, thereby preparing a substrate having a resist film. The thus obtained substrate was further immersed in a 1% aqueous sodium carbonate solution in the same manner as in Example 1. As a result, the resist film was conveniently dissolved in the aqueous sodium carbonate solution.

Comparative Examples 1 to 5

The same procedure as in Examples 1 to 5 was conducted except that the sodium lamp in Examples 1 to 5 was replaced with a fluorescent lamp as a safelight, thereby preparing substrates having a resist film (which was not exposed to YAG or the like) (Comparative Examples 1 to 5 correspond to Examples 1 to 5, respectively). The thus obtained substrates were immersed in a 1% aqueous sodium carbonate solution (Comparative Examples 1 to 4) and a 2.38% aqueous tetramethylammonium hydroxide solution (Comparative Example 5) as developing solutions in the same manner as in Examples 1 to 5. As a result, the resist films were not dissolved in the developing solutions inconveniently.

The spectral distribution of the fluorescent lamp used in the comparative examples is shown in FIG. 5.

What is claimed is:
1. A method for forming a resist pattern which comprises
   (1) a step of applying a negative photosensitive resin composition onto a substrate to form a photosensitive film thereon,
   (2) a step of exposing the surface of the photosensitive film formed on the substrate to a laser beam directly or a light through a negative mask to cure the photosensitive film to obtain a desired image on the surface of the photosensitive film,
   (3) a step of subjecting the resulting photosensitive film to a developing treatment to form a resist pattern on the substrate,
   wherein at least one step of the steps (1) to (3) is carried out under the irradiation of a safelight which is given from a discharge lamp containing sodium as a main component; the negative photosensitive resin composition is a liquid or a solid resin composition containing a photocurable resin, a photoreaction initiator and, if necessary, a photosensitizing dye; and an absorbency of unexposed film formed from this composition being 0.5 or less within the range of the maximum wavelength ±30 nm selected from the range of the maximum wavelength of the safelight.
2. The method for forming a resist pattern according to claim 1, wherein the discharge lamp is covered by a filter to cut an energy-light in a low wavelength of another D-ray which mainly consists of the safelight.
3. The method for forming a resist pattern according to claim 1, wherein the negative photosensitive resin composition further contains organic solvent to form an organic solvent photosensitive resin composition.
4. The method for forming a resist pattern according to claim 3, wherein the organic solvent type photosensitive resin composition is applied onto the surface of the substrate by spray coating, electrostatic coating, spin coating, immersion coating, roller coating, curtain flow coating or silk screen printing.
5. The method for forming a resist pattern according to claim 1, wherein the negative photosensitive resin composition further contains water to form an aqueous photosensitive resin composition.
6. The method for forming a resist pattern according to claim 5, wherein the aqueous photosensitive resin composition is applied onto the surface of a conductor as the substrate by electrodeposition coating.
7. The method for forming a resist pattern according to claim 1, wherein the photosensitive resin composition is applied onto the substrate as a dry film resist.

* * * * *

UNITED STATES PATENT AND TRADEMARK OFFICE
CERTIFICATE OF CORRECTION

PATENT NO. : 6,140,025
DATED : October 31, 2000
INVENTOR(S) : Genji Imai et al.

It is certified that error appears in the above-identified patent and that said Letters Patent is hereby corrected as shown below:

Item [30], please insert -- FOREIGN APPLICATION PRIORITY DATA
Sept. 24, 1997     Japan     9-258194
Jan. 7., 1998      Japan     10-001304
May 29, 1998       Japan     10-148891 --

Signed and Sealed this

Twentieth Day of November, 2001

Attest:

NICHOLAS P. GODICI
*Attesting Officer*   *Acting Director of the United States Patent and Trademark Office*